(12) United States Patent
Hama et al.

(10) Patent No.: US 11,201,063 B2
(45) Date of Patent: Dec. 14, 2021

(54) SUBSTRATE PROCESSING METHOD AND SUBSTRATE PROCESSING APPARATUS

(71) Applicant: Tokyo Electron Limited, Tokyo (JP)

(72) Inventors: Yasutaka Hama, Miyagi (JP); Motoki Noro, Shanghai (CN); Shu Kino, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/843,156

(22) Filed: Apr. 8, 2020

(65) Prior Publication Data

US 2020/0328089 A1 Oct. 15, 2020

(30) Foreign Application Priority Data

Apr. 15, 2019 (JP) .............................. JP2019-077359

(51) Int. Cl.
*H01L 21/311* (2006.01)
*H01J 37/32* (2006.01)
*H01L 21/67* (2006.01)
*H01L 21/683* (2006.01)

(52) U.S. Cl.
CPC .. *H01L 21/31144* (2013.01); *H01J 37/32724* (2013.01); *H01L 21/31116* (2013.01); *H01L 21/31138* (2013.01); *H01L 21/67069* (2013.01); *H01J 37/32183* (2013.01); *H01J 37/32449* (2013.01); *H01J 37/32633* (2013.01); *H01J 37/32651* (2013.01); *H01J 2237/2001* (2013.01); *H01J 2237/3347* (2013.01); *H01L 21/6833* (2013.01)

(58) Field of Classification Search
CPC ......... H01L 21/31144; H01L 21/31138; H01L 21/31116; H01L 21/67069; H01J 37/32724
See application file for complete search history.

(56) References Cited

U.S. PATENT DOCUMENTS

| | | | |
|---|---|---|---|
| 2001/0049150 A1* | 12/2001 | Nakagawa | H01L 21/31138 438/8 |
| 2017/0294310 A1* | 10/2017 | Tapily | H01L 21/0337 |
| 2017/0372916 A1* | 12/2017 | Kudo | H01J 37/32724 |

FOREIGN PATENT DOCUMENTS

JP 2007-005377 1/2007

OTHER PUBLICATIONS

Wikipedia, "Partial Pressure" via https://en.wikipedia.org/wiki/Partial_pressure#:~:text=In%20a%20mixture%20of%20gases,mixture%20at%20the%20same%20temperature. ; pp. 1-8 (Year: 2021).*

* cited by examiner

*Primary Examiner* — Binh X Tran
(74) *Attorney, Agent, or Firm* — IPUSA, PLLC

(57) ABSTRACT

A substrate that includes a first film of a silicon-containing film and a second film having a second aperture formed on the first film is subjected to processing that includes: preparing the substrate; controlling a temperature of the substrate to −30° C. or less; and etching the first film through the second aperture using a plasma formed from a first process gas containing a fluorocarbon gas. By etching the first film through the second aperture, a first aperture of a tapered shape is formed in the first film such that a width of the first aperture gradually decreases toward a bottom of the first aperture.

18 Claims, 11 Drawing Sheets

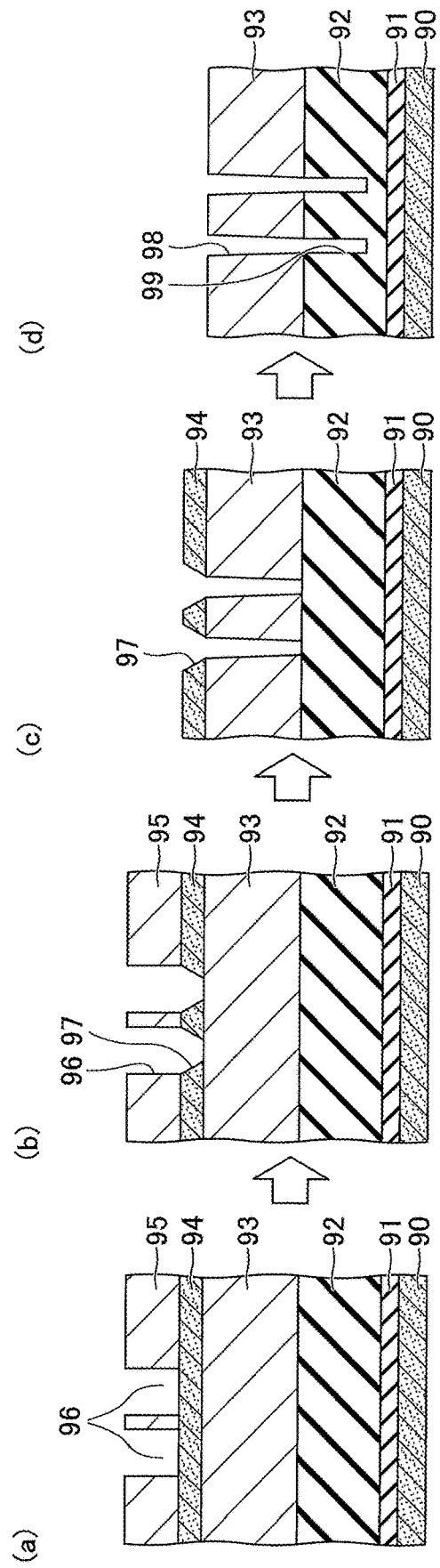

FIG.4A

| WAFER TEMPERATURE | −45°C | 0°C | 30°C |
|---|---|---|---|
| WITHOUT $H_2$ | | | |
| CD | 13.5 nm | 19.2 nm | 20.9 nm |
| $CF_4:H_2$=25:3 | | | |
| CD | 8.8 nm | 16.8 nm | 17.0 nm |

FIG.4B

| WAFER TEMPERATURE | −45°C | 0°C | 30°C |
|---|---|---|---|
| $CF_4/CHF_3$ ratio=1.5 | | | |
| CD | no pattern | 13.0 nm | 12.2 nm |
| $CF_4/CHF_3$ ratio=2.5 | | | |
| CD | no pattern | 11.5 nm | 9.4 nm (MANY BLINDS) |

SUBSTRATE PROCESSING METHOD AND SUBSTRATE PROCESSING APPARATUS

CROSS-REFERENCE TO RELATED APPLICATIONS

This patent application is based upon and claims priority to Japanese Patent Application No. 2019-077359 filed on Apr. 15, 2019, the entire contents of which are incorporated herein by reference.

TECHNICAL FIELD

The present disclosure relates to a substrate processing method and a substrate processing apparatus.

BACKGROUND

As wafer processing becomes finer, wiring widths and contact hole diameters formed on wafers tend to be smaller. Accordingly, plasma etching methods have been proposed which allow etching the etch target film into a finer linewidth or contact hole pattern.

For example, Patent Document 1 describes a technique for etching an organic film layer more finely. In the technique described in Patent Document 1, an intermediate layer of a silicon oxide film, which is formed on the organic film layer, is etched such that the size of an aperture at the bottom of the intermediate layer is smaller than the size of the corresponding pattern of a resist layer formed on the intermediate layer. Thus, the organic film layer is more finely etched than the pattern of the resist layer.

However, when a mask pattern is transferred to an etching target film, if etching is performed using a process gas having a precursor causing deposition easily, deposits adhere to the upper portion of the mask pattern, and the deposits may occlude apertures of the mask pattern.

CITATION LIST

[Patent Document]
[Patent Document 1] Japanese Laid-open Patent Application Publication No. 2007-005377

SUMMARY

According to one aspect of the present disclosure provides for a method of processing a substrate that includes a first film of a silicon-containing film and a second film formed on the first film and having a second aperture. The method includes: preparing the substrate; controlling a temperature of the substrate to −30° C. or less; and etching the first film through the second aperture using a plasma formed from a first process gas containing a fluorocarbon gas. By etching the first film through the second aperture, a first aperture of a tapered shape is formed in the first film such that a width of the first aperture gradually decreases toward a bottom of the first aperture.

BRIEF DESCRIPTION OF THE DRAWINGS

FIG. 3 is a diagram illustrating an example of etching steps for each layer of the first layered structure according to the embodiment;

FIG. 4A is a diagram illustrating an example of a result of the etching process according to the embodiment;

FIG. 4B is a diagram illustrating an example of a result of the etching process according to a comparative example;

DETAILED DESCRIPTION OF EMBODIMENTS

Figure 1:
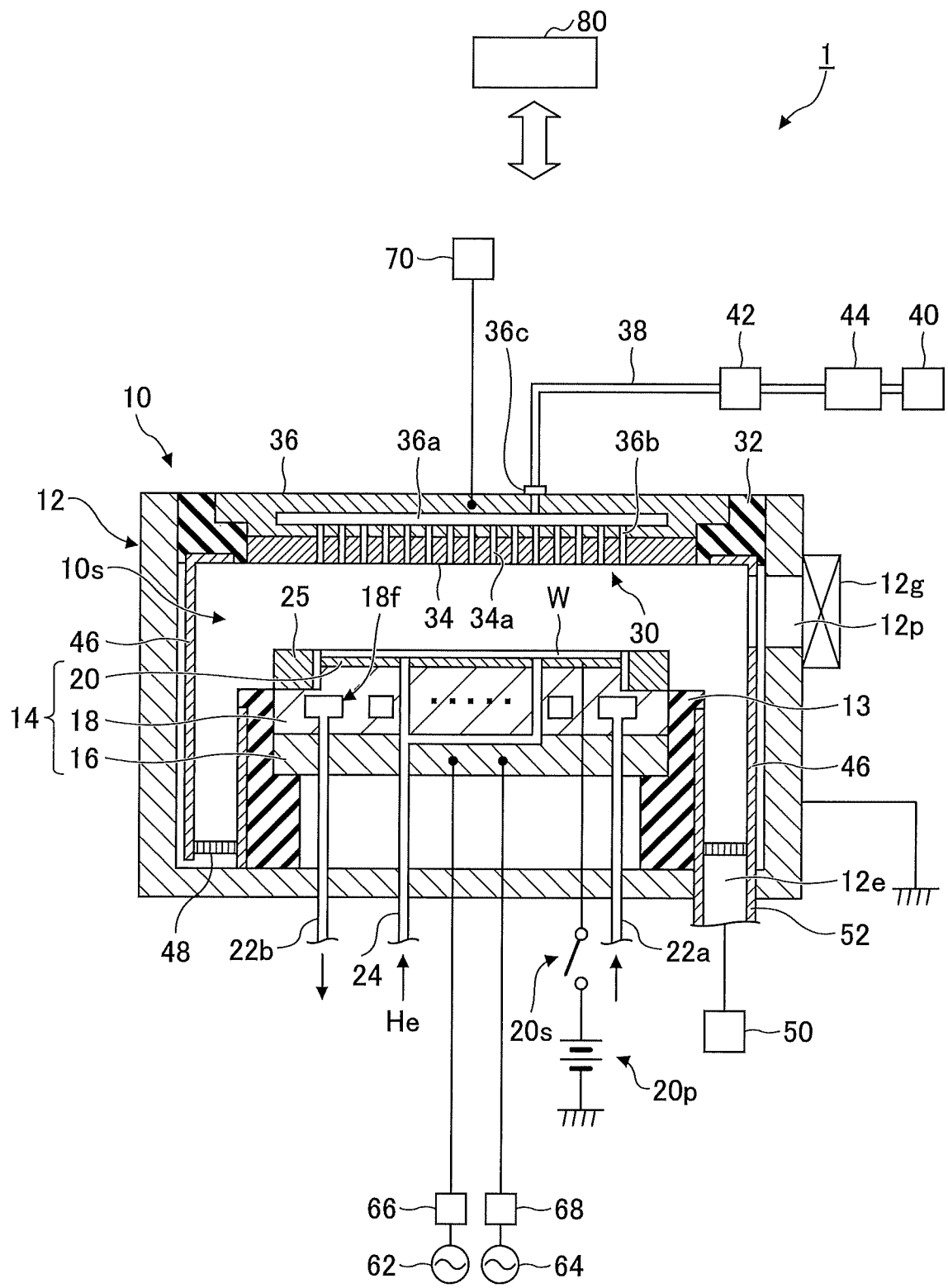
FIG. 1 is a cross-sectional view illustrating an example of a substrate processing apparatus according to an embodiment.

In the following, embodiments of the present invention will be described with reference to the drawings. Note that in the drawings, elements having substantially identical features are given the same reference symbols and overlapping descriptions may be omitted.

<Substrate Processing Apparatus>

A substrate processing apparatus 1 according to an embodiment will be described with reference to FIG. 1. FIG. 1 is a cross-sectional diagram illustrating an example of the substrate processing apparatus 1 according to the present embodiment.

The substrate processing apparatus 1 includes a processing vessel 10. The processing vessel 10 provides an inner space 10s therein. The processing vessel 10 includes a processing vessel body 12. The processing vessel body 12 has a generally cylindrical shape. The processing vessel body 12 may be formed of aluminum, for example. A corrosion-resistant film is provided on an inner surface of the processing vessel body 12. The film may be a ceramic such as aluminum oxide, yttrium oxide and the like.

A passage 12p is formed in the side wall of the processing vessel body 12. A substrate W is conveyed between the inner space 10s and the exterior of the processing vessel 10 through the passage 12p. The passage 12p is opened and closed by a gate valve 12g provided along the side wall of the processing vessel body 12.

A support 13 is provided on the bottom of the processing vessel body 12. The support 13 is formed of an insulating material. The support 13 has a generally cylindrical shape. The support 13 extends upward from the bottom of the processing vessel body 12 in the inner space 10s. A stage 14 is attached to an upper portion of the support 13. The stage 14 is configured to support the substrate W in the inner space 10s.

The stage 14 includes a lower electrode 18 and an electrostatic chuck 20. The stage 14 may further include an electrode plate 16. The electrode plate 16 is formed of a conductor such as aluminum, and is generally of a disc shape. The lower electrode 18 is provided on the electrode plate 16. The lower electrode 18 is formed of a conductor such as aluminum, and is generally of a disc shape. The lower electrode 18 is electrically connected to the electrode plate 16.

The electrostatic chuck 20 is provided on the lower electrode 18. The substrate W is placed on the top surface of the electrostatic chuck 20. The electrostatic chuck 20 includes a body and an electrode. The body of the electrostatic chuck 20 is generally of a disc shape, and is formed of a dielectric material. The electrode of the electrostatic chuck 20 is a film-like electrode, and is embedded in the body of the electrostatic chuck 20. The electrode of the electrostatic chuck 20 is connected to a direct-current (DC) power supply 20p via a switch 20s. When DC voltage is applied from the DC power supply 20p to the electrode of the electrostatic chuck 20, electrostatic attracting force is generated between the electrostatic chuck 20 and the substrate W. The substrate W is held on the electrostatic chuck 20 by the electrostatic attractive force.

An edge ring 25 is disposed on the periphery of the lower electrode 18 to surround an edge of the substrate W. The edge ring 25 may also be referred to as a focus ring. The edge ring 25 improves in-plane uniformity of a plasma process for the substrate W. The edge ring 25 may be formed of silicon, silicon carbide, quartz, or the like.

A flow passage 18f is formed in the lower electrode 18. Coolant, such as brine, is supplied to the flow passage 18f from a chiller unit (not illustrated) disposed outside the processing vessel 10 through a pipe 22a. The coolant supplied to the flow passage 18f is returned to the chiller unit via the pipe 22b. In the substrate processing apparatus 1, the temperature of the substrate W placed on the electrostatic chuck 20 is controlled in accordance with heat exchange between the coolant and the lower electrode 18. The coolant supplied from the chiller unit may not only cool the lower electrode 18, but also function as a temperature controlling medium to warm the lower electrode 18. The temperature of the coolant (temperature controlling medium) is adjusted by the chiller unit such that the temperature value detected by a temperature sensor (not illustrated) provided on the electrostatic chuck 20 (or the lower electrode 18) is maintained at a predetermined value.

The substrate processing apparatus 1 is provided with a gas supply line 24. The gas supply line 24 supplies heat transmitting gas (e.g., He gas) from a heat transmitting gas supply mechanism to a gap between an upper surface of the electrostatic chuck 20 and a bottom surface of the substrate W.

The substrate processing apparatus 1 further includes an upper electrode 30. The upper electrode 30 is located above the stage 14. The upper electrode 30 is supported at the top of the processing vessel body 12 via a member 32. The member 32 is formed of an insulating material. The upper electrode 30 and the member 32 occlude an upper opening of the processing vessel body 12.

The upper electrode 30 may include a top plate 34 and a support member 36. The lower surface of the top plate 34 faces the inner space 10s. The lower surface of the top plate 34 is one of the components that defines the inner space 10s. The top plate 34 may be formed of a low resistance conductor or semiconductor with low Joule heat generation. The top plate 34 includes multiple gas discharge holes 34a that penetrate the top plate 34 in a thickness direction of the top plate 34.

The support member 36 removably supports the top plate 34. The support member 36 is formed of an electrically conductive material such as aluminum. Inside the support member 36 is a gas diffusion chamber 36a. The support member 36 includes multiple gas holes 36b extending downward from the gas diffusion chamber 36a. Each of the multiple gas holes 36b communicates with a corresponding one of the multiple gas discharge holes 34a. A gas inlet 36c is formed in the support member 36. The gas inlet 36c is connected to the gas diffusion chamber 36a. A gas supply line 38 is connected to the gas inlet 36c.

Valves 42, flow controllers 44, and gas sources 40 are connected to the gas supply line 38. In the present embodiment, a set of the gas sources 40, the valves 42, and the flow controllers 44 is referred to a gas supply section. Each of the flow controllers 44 may be a mass flow controller or a pressure-controlled flow controller. Each of the valves 42 may be an open/close valve. Each of the gas sources 40 is connected to the gas supply line 38 via a corresponding one of the valves 42 and a corresponding one of the flow controllers 44.

In the substrate processing apparatus 1, a removable shield 46 is provided along a surface of the inner side wall of the processing vessel body 12 and along a surface of the outer circumference of the support 13. The shield 46 prevents reaction products from adhering to the processing vessel body 12. The shield 46 may be, for example, constructed by forming a corrosion-resistant film on a surface of a base material formed of aluminum. The corrosion resistant film may be made of a ceramic such as yttrium oxide.

A baffle plate 48 is provided between the outer circumference of the support 13 and the inner side wall of the processing vessel body 12. The baffle plate 48 may be, for example, constructed by forming a corrosion-resistant film (such as a film made of yttrium oxide) on a surface of a base material formed of aluminum. Multiple through-holes are formed in the baffle plate 48. An exhaust port 12e is provided below the baffle plate 48 and at the bottom of the processing vessel body 12. An exhaust device 50 is connected to the exhaust port 12e via an exhaust pipe 52. The exhaust device 50 includes a pressure control valve and a vacuum pump such as a turbomolecular pump.

The substrate processing apparatus 1 includes a first radio frequency power supply 62 and a second radio frequency power supply 64. The first radio frequency power supply 62 is a power supply that generates first radio frequency electric power (hereinafter referred to as "HF power"). The first radio frequency electric power has a frequency suitable for generating a plasma. The frequency of the first radio frequency electric power is in the range of 27 MHz to 100 MHz, and may be, for example, 40 MHz. The first radio frequency power supply 62 is connected to the lower electrode 18 via a matching device 66 and the electrode plate 16. The matching device 66 includes circuitry for causing output impedance of the first radio frequency power supply 62 to match impedance of a load (lower electrode 18). The first radio frequency power supply 62 may be connected to the upper electrode 30 via the matching device 66. The first radio frequency power supply 62 constitutes an example of a plasma generator.

The second radio frequency power supply 64 is a power supply that generates second radio frequency electric power (hereinafter referred to as "LF power"). The second radio frequency electric power has a frequency lower than the frequency of the first radio frequency electric power. If a second radio frequency electric power is used in conjunction with the first radio frequency electric power, the second radio frequency electric power is used as radio frequency electric power for bias voltage, to draw ions into the substrate W. The frequency of the second radio frequency electric power is in a range of, for example, 400 kHz to 13.56 MHz, and may be 13.56 MHz for example. The second radio frequency power supply 64 is connected to the lower electrode 18 via a matching device 68 and the electrode plate 16. The matching device 68 includes circuitry for causing output impedance of the second radio frequency power supply 64 to match the impedance of the load (lower electrode 18).

It should be noted that a plasma may be generated using the second radio frequency electric power, without using the first radio frequency electric power. That is, only the single radio frequency electric power may be used for generating a plasma. In this case, the frequency of the second radio frequency electric power may be greater than 13.56 MHz, for example 40 MHz. Also, in this case, the second radio frequency power supply 64 constitutes an example of the plasma generator, and the substrate processing apparatus 1 does not need to include the first radio frequency power supply 62 and the matching device 66.

In the substrate processing apparatus 1, a gas is supplied from the gas supply section to the inner space 10s to generate a plasma. Also, by the first radio frequency electric power and/or the second radio frequency electric power being supplied, a radio-frequency electric field is generated between the upper electrode 30 and the lower electrode 18. The gas is formed into the plasma by the generated radio-frequency electric field.

The substrate processing apparatus 1 includes a power supply 70. The power supply 70 is connected to the upper electrode 30. The power supply 70 applies DC voltage to the upper electrode 30 to draw positive ions that are present in the inner space 10s into the top plate 34. The DC voltage applied to the upper electrode 30 is in a range equal to or greater than −1000 V and equal to or smaller than 0 V.

The substrate processing apparatus 1 may further include a controller 80. The controller 80 may be a computer including a processor, a storage device such as a memory, an input device, a display device, an input/output interface of signals, and the like. The controller 80 controls each part of the substrate processing apparatus 1. By using the input device, an operator of the substrate processing apparatus 1 can input commands to the controller 80 to manage the substrate processing apparatus 1. Also, the controller 80 can display an operating status of the substrate processing apparatus 1 on the display device. Further, a control program and recipe data are stored in the storage device. The control program is executed by the processor, which executes various processes in the substrate processing apparatus 1. The processor executing the control program controls each part of the substrate processing apparatus 1, in accordance with the recipe data.

<Etching of Substrate Having First Layered Structure>

Figure 2:
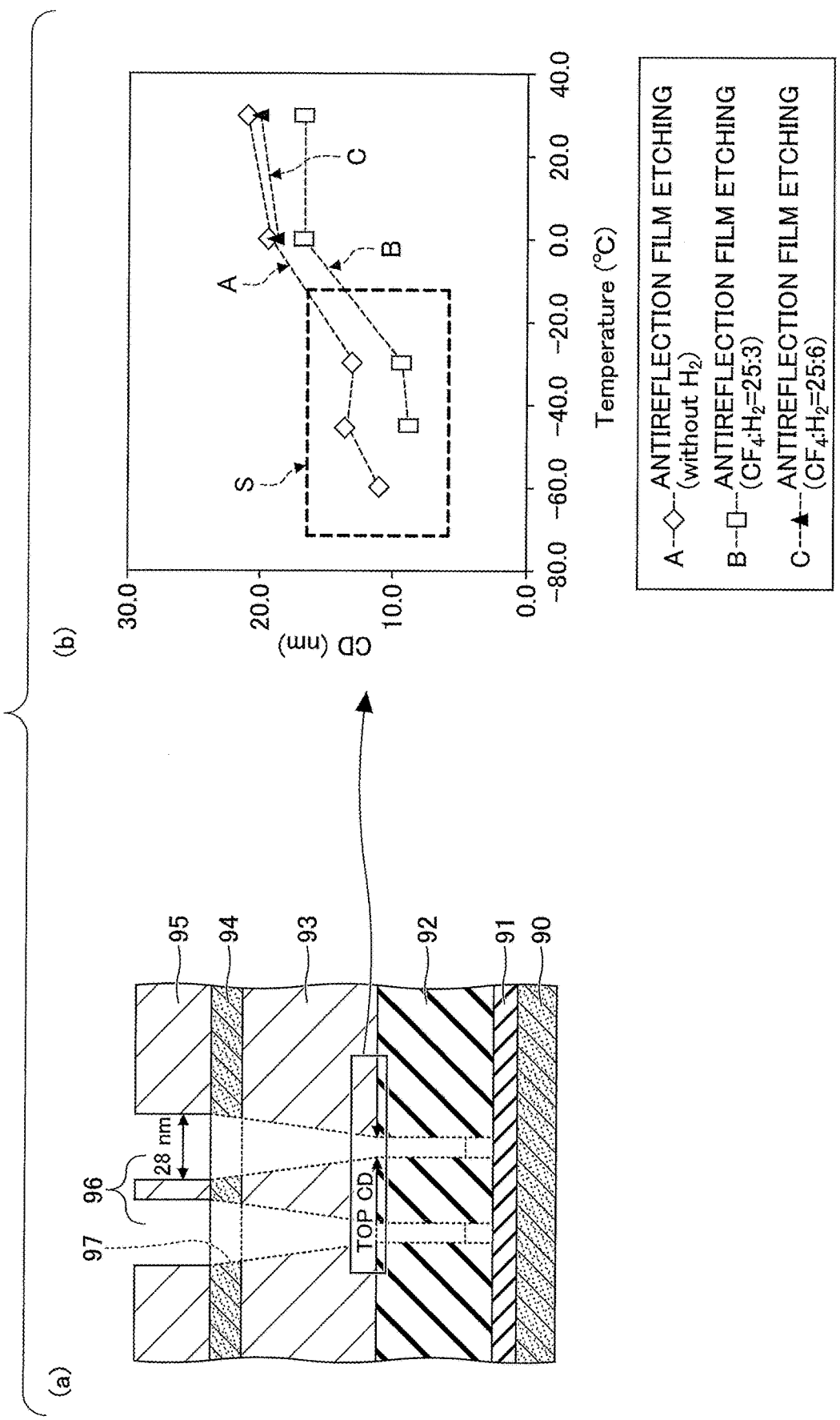
FIG. 2 is a view illustrating an outline of an etching process of a first layered structure according to the embodiment.

Next, an etching process of the substrate W (may also be referred to as a "wafer W") using the above-described substrate processing apparatus 1 will be described with reference to FIGS. 2 and 3. FIG. 2 is a diagram illustrating an outline of the etching process according to the present embodiment that is applied to a first layered structure. FIG. 3 is a diagram illustrating an example of steps of etching each layer of the first layered structure illustrated in a diagram (a) of FIG. 2.

The first layered structure on the substrate W to be etched is illustrated in the diagram (a) of FIG. 2 and a diagram (a) of FIG. 3. The first layered structure is an example of a multi-film structure formed on the substrate W. As illustrated in the diagram (a) of FIG. 2, in the first layered structure, from the bottom, a silicon nitride film 91, a silicon oxide film 92, an organic film 93, a silicon-containing antireflection film 94, and a photoresist 95 are layered on a silicon substrate 90. Note that the silicon nitride film 91 may or may not be provided.

The photoresist 95, the silicon-containing antireflection film 94, and the organic film 93 can function as masks. The photoresist 95 has apertures 96. In the following description, the apertures 96 may be referred to as "second apertures 96". The second apertures 96 are regularly arranged in a plan view of the photoresist 95, and the photoresist 95 is patterned by photolithography. The silicon-containing antireflection film 94 is etched by using the photoresist 95 as a mask, thereby forming apertures 97 (may also be referred to as "first apertures 97") in the silicon-containing antireflection film 94. The silicon-containing antireflection film 94 is an example of a first film that is a silicon-containing film. The photoresist 95 is an example of a second film formed on the first film and having a second aperture.

An example of the first film, which is a silicon-containing film, may be a silicon oxide film containing an organic substance, such as hydrocarbons. Alternatively, a silicon oxynitride film, such as SiON, may be used. These films are used as an antireflection film when forming the second apertures 96 as an exposure pattern in the photoresist 95 by photolithography.

The organic film 93 is a spin-on carbon film formed on the silicon oxide film 92 by spin coating. However, the organic film 93 may be an amorphous carbon film that is deposited on the silicon oxide film 92 by chemical vapor deposition (CVD). The organic film 93, the silicon-containing antireflection film 94, and the photoresist 95 function as masks to etch the silicon oxide film 92. The etching of the silicon oxide film 92 is made until the silicon nitride film 91 is exposed at the bottom of a recess formed by the etching.

First, the silicon-containing antireflection film 94 is etched through the second apertures 96 in the photoresist 95. Process conditions during the etching of the silicon-containing antireflection film 94 are as follows.

<Process Conditions During Etching of the Silicon-Containing Antireflection Film 94>

Pressure: 50 mTorr (6.67 Pa)
HF power: 300 W
LF power: 300 W
Gas type: $CF_4$, $H_2$
Substrate temperature: variable Three types of experiments were performed by using different gases. In a first experiment, only $CF_4$ was used and $H_2$ was not used. A second experiment used a mixed gas containing $CF_4$ and $H_2$ at a ratio of $CF_4$:$H_2$=25:3. A third experiment used a mixed gas containing $CF_4$ and $H_2$ at a ratio of $CF_4$:$H_2$=25:6.

It should be noted that the supplied $CF_4$ gas and the supplied mixed gas of $CF_4$ gas and $H_2$ gas are examples of a first process gas. Fluorine-containing gas, such as $SF_6$ gas or $NF_3$ gas may be added to the $CF_4$ gas.

The temperature of the substrate is controlled by the temperature of the electrostatic chuck 20 adjusted to a predetermined temperature by the chiller unit, as heat of the electrostatic chuck 20 is transferred to the substrate through the surface of the electrostatic chuck 20 and the heat transmitting gas. However, the substrate temperature, particularly the temperature of the surface of the substrate facing a plasma, may become higher than the adjusted temperature of the electrostatic chuck 20, because the substrate is exposed to the plasma generated by the first radio frequency electric power for plasma excitation, thereby being irradiated with light of the plasma and being bombarded with ions drawn by the second radio frequency electric power for bias voltage. The temperature of the substrate can also be increased by radiant heat from the upper electrode or the side wall of the processing vessel body 12. Thus, if an actual substrate temperature can be measured during the etching process, or if a temperature difference between the adjusted temperature of the electrostatic chuck 20 and an actual surface temperature of the substrate can be estimated from the process conditions, a temperature setting of the electrostatic chuck 20 may be lowered to adjust the temperature of the substrate to a predetermined temperature range. If it is assumed that the temperature difference between the adjusted temperature of the electrostatic chuck 20 and the actual surface temperature of the substrate is small, such as in a case in which the first radio frequency electric power and the second radio frequency electric power are small, the substrate temperature may be considered as being equal to the temperature of the electrostatic chuck 20.

After the silicon-containing antireflection film 94 is etched, the organic film 93 is etched using the silicon-containing antireflection film 94 as a mask. Process conditions during etching of the organic film 93 are as follows.

<Process Conditions During Etching of the Organic Film 93>
Pressure: 15 mTorr (2.00 Pa)
HF Power: 100 W
LF Power: 750 W
Gas type: $N_2$, $H_2$
Substrate temperature: variable In the following description, "extremely low temperature" means a temperature equal to or less than $-30°$ C., and "ordinary temperature" means a temperature of $0°$ C. or more and in the vicinity of a room temperature. Also, the supplied mixed gas of $N_2$ gas and $H_2$ gas is an example of a second process gas. Other examples of the second process gas may include $O_2$ gas, a mixture of $O_2$ gas and $CO_2$ gas, a mixture of $O_2$ gas and $SO_2$ gas, and a mixture of $O_2$ gas and COS gas.

The etching of the organic film 93 is not required to be carried out at an extremely low temperature, but may be carried out at an ordinary temperature. However, an extremely low temperature environment facilitates mass production. Also, an effect of shrinking critical dimension (CD) can be obtained in etching under the extremely low temperature environment. Therefore, it is preferable to control a substrate temperature at the extremely low temperature. The type of gas used to etch the organic film 93 is not limited to the mixed gas of $N_2$ gas and $H_2$ gas. A mixture of $O_2$ gas and $CO_2$ gas, a mixture of $O_2$ gas and $SO_2$ gas, a mixture of $O_2$ gas and COS gas, or the like, may be used.

After etching the organic film 93, the silicon oxide film 92 is etched using the organic film 93 as a mask. Process conditions during the etching of the silicon oxide film 92 are as follows.

<Process Conditions During Etching of Silicon Oxide Film 92>
Pressure: 25 mTorr (3.33 Pa)
HF power: 0 W
LF power: 800 W
Gas type: $CF_4$, $H_2$
Substrate temperature: $-45°$ C.

The etching of the silicon oxide film 92 need not be carried out at an extremely low temperature, but may be carried out at an ordinary temperature. However, as the reaction product generated during etching is adhered to the inner wall of the etched silicon oxide film 92 under an extremely low temperature environment, an effect of protecting the inner wall of the etched silicon oxide film 92 is obtained. Thus, etching of the sidewall of an etched hole (or recess) formed in the silicon oxide film 92 can be suppressed. Therefore, it is preferable to control the substrate temperature to extremely low temperatures. Also, it is easy to maintain an etching profile of the silicon oxide film 92 in a vertical shape. Furthermore, it is preferable to perform the operation at an extremely low temperature in order to obtain an effect of shrinking an etching profile. The type of gas used in the etching of the silicon oxide film 92 is not limited to the above-mentioned gas, and a mixture of $C_4F_6$ gas, $O_2$ gas and Ar gas, a mixture of $C_4F_8$ gas, $O_2$ gas and Ar gas, or the like may be used.

An example of a result of etching the silicon-containing antireflection film 94, the organic film 93, and the silicon oxide film 92 in sequence according to the above-described process conditions is illustrated in a diagram (b) of FIG. 2. The horizontal axis of the diagram (b) of FIG. 2 indicates the substrate temperature during etching of the silicon-containing antireflection film 94 and the organic film 93. The vertical axis of the diagram (b) of FIG. 2 indicates a CD value (hereinafter referred to as a "TOP CD value") representing a width of an aperture at an upper end formed in the silicon oxide film 92, after the silicon oxide film 92 is etched until the silicon nitride film 91 is exposed and the organic film 93 is further removed by asking, which is illustrated in a frame of the diagram (a) of FIG. 2.

The curve A illustrated in the diagram (b) of FIG. 2 represents the TOP CD value in a case in which only $CF_4$ gas is supplied and no $H_2$ gas is added during etching of the silicon-containing antireflection film 94. The curve B represents the TOP CD value in a case in which $H_2$ gas is added to the $CF_4$ gas in a ratio of $CF_4:H_2=25:3$ during etching of the silicon-containing antireflection film 94. The curve C represents the TOP CD value in a case in which $H_2$ gas is added to the $CF_4$ gas in a ratio of $CF_4:H_2=25:6$ during etching of the silicon-containing antireflection film 94.

According to the result illustrated in the diagram (b) of FIG. 2, the CD value became approximately 13 nm or less when the substrate temperature was set to $-30°$ C. or less, which corresponds to a region surrounded by a frame S shown with the dashed line (hereinafter, this temperature condition may be referred to as an "extremely low temperature condition"), and the TOP CD value shrank more as compared to a case in which etching is performed at an ordinary temperature. Specifically, as illustrated in the diagram (a) of FIG. 2, in a case of the curve A in which $H_2$ was not added to $CF_4$, the TOP CD value was 13.5 nm or less, while a CD value (width) of the second aperture 96 of the photoresist 95 was 28 nm. In other words, by supplying the gas containing $CF_4$ gas (hereinafter, referred to as the "first process gas") during etching of the silicon-containing antireflection film 94 under the extremely low temperature condition, the TOP CD value could be shrunk.

Furthermore, in a case of the curve B in which $H_2$ was added to $CF_4$, the TOP CD value became less than 10 nm under the extremely low temperature condition. From the above, it has been found that if $H_2$ is added to $CF_4$ during the etching process of the silicon-containing antireflection film 94, the TOP CD value can be shrunk significantly compared to a case in which $H_2$ is not added to $CF_4$.

Accordingly, in a step of etching the silicon-containing antireflection film 94 illustrated in a diagram (a) and a diagram (b) of FIG. 3, a plasma formed from the first process gas containing $CF_4$ gas is used, and the substrate temperature is controlled to be equal to or less than −30° C. Then, the silicon-containing antireflection film 94 exposed from the second aperture 96 is etched.

Accordingly, as illustrated in the diagram (b) of FIG. 3, a cross-section of the first aperture 97 in the silicon-containing antireflection film 94 is formed into a tapered shape, such that a size (width) of a hole (first aperture 97) formed in the silicon-containing antireflection film 94 gradually decreases toward a bottom of the hole (first aperture 97) in a cross-sectional view. That is, a cross-section of the first aperture 97 is formed into a tapered shape such that a size (width) of the first aperture 97 on a side opposite the photoresist 95 is smaller than a size (width) of the first aperture 97 on a side of the photoresist 95. This allows the TOP CD value of the silicon oxide film 92 to be less than half of the CD value of the second aperture 96 of the photoresist 95 when etching the silicon oxide film 92, thereby forming a small contact in the shrunken recess. Further, by supplying the first process gas with $H_2$ gas, a tapered angle can be made to be greater (the slope of the cross section of the first aperture 97 in the silicon-containing antireflection film 94 can be made to be gentler) as compared to a case in which $H_2$ is not added, thereby increasing the effect of shrinking the TOP CD value.

In addition, as illustrated in a diagram (c) of FIG. 3, the first aperture 97 of the silicon-containing antireflection film 94 was not clogged in both cases in which $H_2$ was not added to $CF_4$ during etching of the silicon-containing antireflection film 94 and in which $H_2$ was added to $CF_4$ in a ratio of $CF_4:H_2=25:3$. Further, in a step of etching the silicon oxide film 92 through the aperture 98 formed in the organic film 93, as illustrated in a diagram (d) of FIG. 3, the silicon oxide film 92 could be etched until the silicon nitride film 91 was exposed without the aperture 98 becoming clogged. However, in a case in which $H_2$ was added to $CF_4$ in a ratio of $CF_4:H_2=25:6$ under the extremely low temperature condition, the CD value significantly decreased, and an aperture was not formed on the silicon oxide film 92. Therefore, the CD value under the extremely low temperature condition could not be indicated in the diagram (b) of FIG. 2.

FIG. 4A is a diagram illustrating an example of a result of the etching process according to the present embodiment, and FIG. 4B is a diagram illustrating an example of a result of an etching process according to a comparative example. FIG. 4A illustrates an example of a top view of holes 99 formed in the silicon oxide film 92 of the first layered structure, which illustrates a state after each etching step according to the present embodiment has been performed and the organic film 93 illustrated in the diagram (d) of FIG. 3 has been removed by ashing. FIG. 4B illustrates an example of a top view of holes 109 formed in a silicon oxide film 92 of the first layered structure by performing each etching step according to the comparative example.

In etching the silicon-containing antireflection film 94 of the first layered structure, experiments were performed by changing the substrate temperature and by changing the process gas. Also, with respect to the substrate temperature, etching was performed in cases of −45° C., 0° C., and 30° C. The etching process of the silicon-containing antireflection film 94 of the first layered structure according to the comparative example differs from that according to the present embodiment in that a mixed gas of $CHF_3$ gas and $CF_4$ gas was supplied in the comparative example, while $CF_4$ gas or a mixed gas of $CF_4$ gas and $H_2$ gas was supplied in the present embodiment. The process conditions in the etching process of the organic film 93 and the silicon oxide film 92 according to the comparative example are the same as those according to the present embodiment.

As a result of the etching process according to the comparative example, in a case in which the substrate temperature is 0° C. and 30° C., although the TOP CD value of the silicon oxide film 92 was shrunk to approximately 10 nm, openings of the holes 109 are not regularly arranged, and some holes 109 are not formed on the silicon oxide film 92 (in the following description, a point on the silicon oxide film 92 in which a hole 109 was to be formed but in which the hole 109 could not be formed as a result of etching is referred to as a "blind"). That is, the silicon oxide film 92 is not etched in the same pattern as the pattern of the second apertures in the photoresist 95. It is assumed that this is because some apertures (in the silicon-containing antireflection film 94 or in the photoresist 95) became clogged with reaction products produced during etching of the silicon-containing antireflection film 94. Also, in a case in which the substrate temperature was −45° C., an amount of reaction products produced during etching was further increased, and no holes 109 were formed on the silicon oxide film 92.

On the other hand, as a result of performing the etching process according to the present embodiment, in cases in which the substrate temperature is 0° C. and 30° C., openings of the holes 99 were arranged regularly and no blinds were seen. However, even if $H_2$ gas was added to $CF_4$ gas, the TOP CD value did not fall below 10 nm, and shrinkage of the TOP CD value was limited. Conversely, in a case in which the substrate temperature was −45° C., the silicon oxide film 92 could be etched in the same pattern as the pattern of the second apertures in the photoresist 95 while avoiding generation of blinds and reducing the TOP CD value of the silicon oxide film 92 to less than 10 nm.

Thus, in order to shrink apertures in the silicon-containing antireflection film 94 without occluding the second aperture 96 of the photoresist 95, it is necessary to control the substrate temperature to an extremely low temperature of −30° C. or less in the etching process. Meanwhile, in the step of etching the organic film 93 and the step of etching the silicon oxide film 92, it is not necessary to set the substrate temperature to the extremely low temperature of −30° C. or less. The substrate temperature may be set to −30° C. or higher. However, as described above, it is preferable to control the substrate temperature to the extremely low temperature even in the step of etching the organic film 93 and in the step of etching the silicon oxide film 92.

<Amount of $H_2$ Added>

Figure 5:
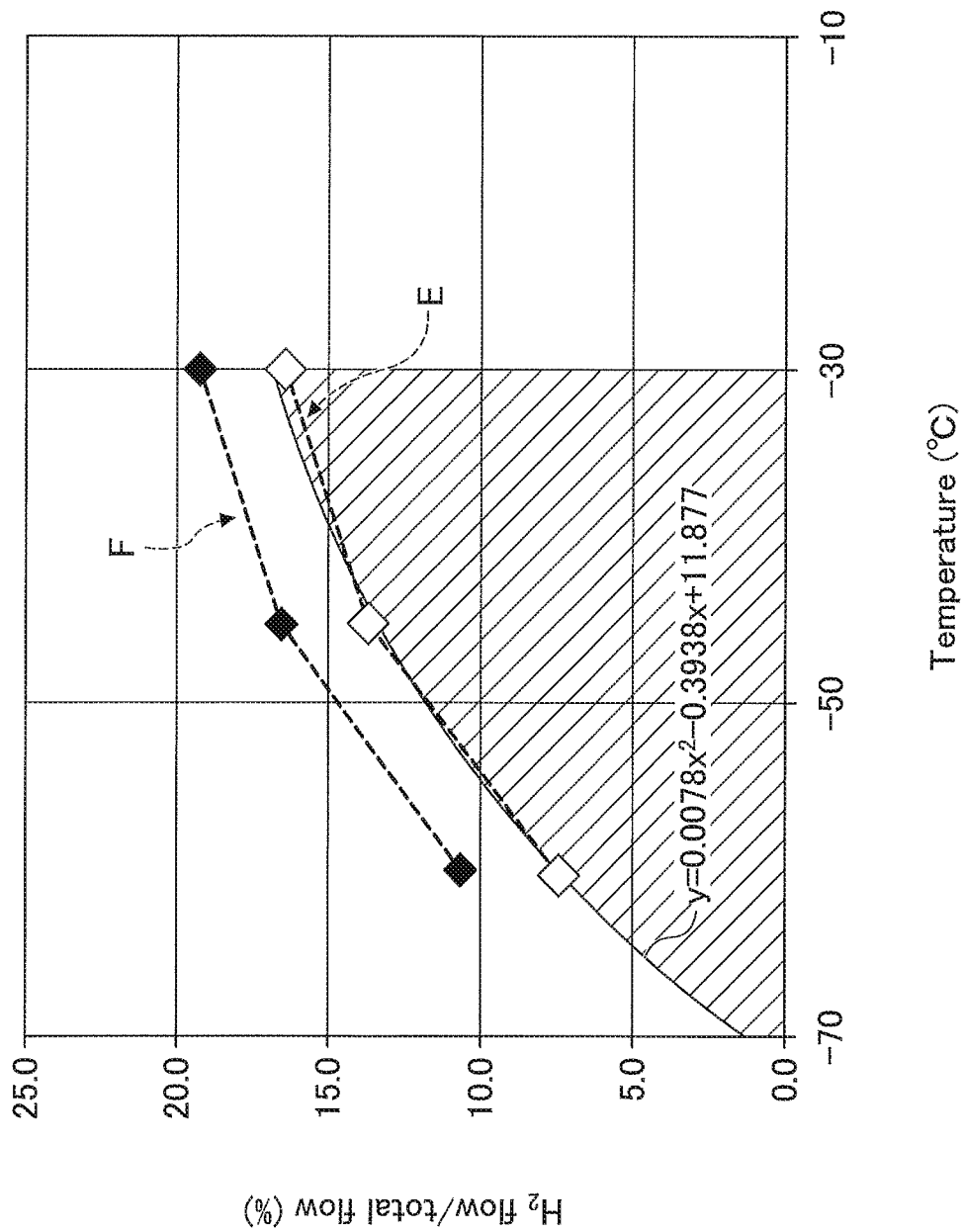
FIG. 5 is a diagram illustrating a relationship between an amount of $H_2$ added in the etching process according to the present embodiment and blockage of an aperture.

Next, the amount of $H_2$ gas to be added will be described with reference to FIG. 5. FIG. 5 is a diagram illustrating the relationship between the amount of $H_2$ added in the etching process according to the present embodiment and blockage of an upper end portion of an aperture. The horizontal axis of FIG. 5 indicates the substrate temperature, and the vertical axis of FIG. 5 indicates a flow ratio of $H_2$ gas with respect to a total flow of a mixed gas of $CF_4$ gas and $H_2$ gas during the etching process of the silicon-containing antireflection film 94.

The curve E in FIG. 5 represents a case in which CD is shrunk and in which no blind is present, that is, the curve E represents a case in which the holes 99 having shrunken CD are formed and are regularly arranged on the silicon oxide film 92. Meanwhile, a curve F in FIG. 5 represents a case in which CD is shrunk but in which blinds are present. That is, the curve F represents a case in which the holes 99 having shrunken CD are formed but are irregularly arranged on the silicon oxide film 92, such that one or more holes 99 is not formed on the silicon oxide film 92 or no holes 99 are formed on the silicon oxide film 92.

According to the results illustrated in FIG. 5, if $H_2$ gas is added to the first process gas such that an amount of $H_2$ gas contained in the first process gas satisfies the following formula (1), the effect of shrinking CD is obtained, and regularly arranged holes 99, similar to the pattern of the second apertures in the photoresist 95, can be formed in the silicon oxide film 92, without causing a portion in which the holes 99 could not be formed.

$$0 \leq y \leq 0.0078x^2 - 0.3938x + 11.877 \quad (1)$$

where y is a partial pressure percentage (%) of $H_2$ gas, which is a ratio of a flow rate of $H_2$ gas with respect to a total flow rate of a mixed gas of $CF_4$ gas and $H_2$ gas (total flow rate of the first process gas), and x is the substrate temperature.

<Relationship Between Gas Type and Deposition State>

Figure 6:
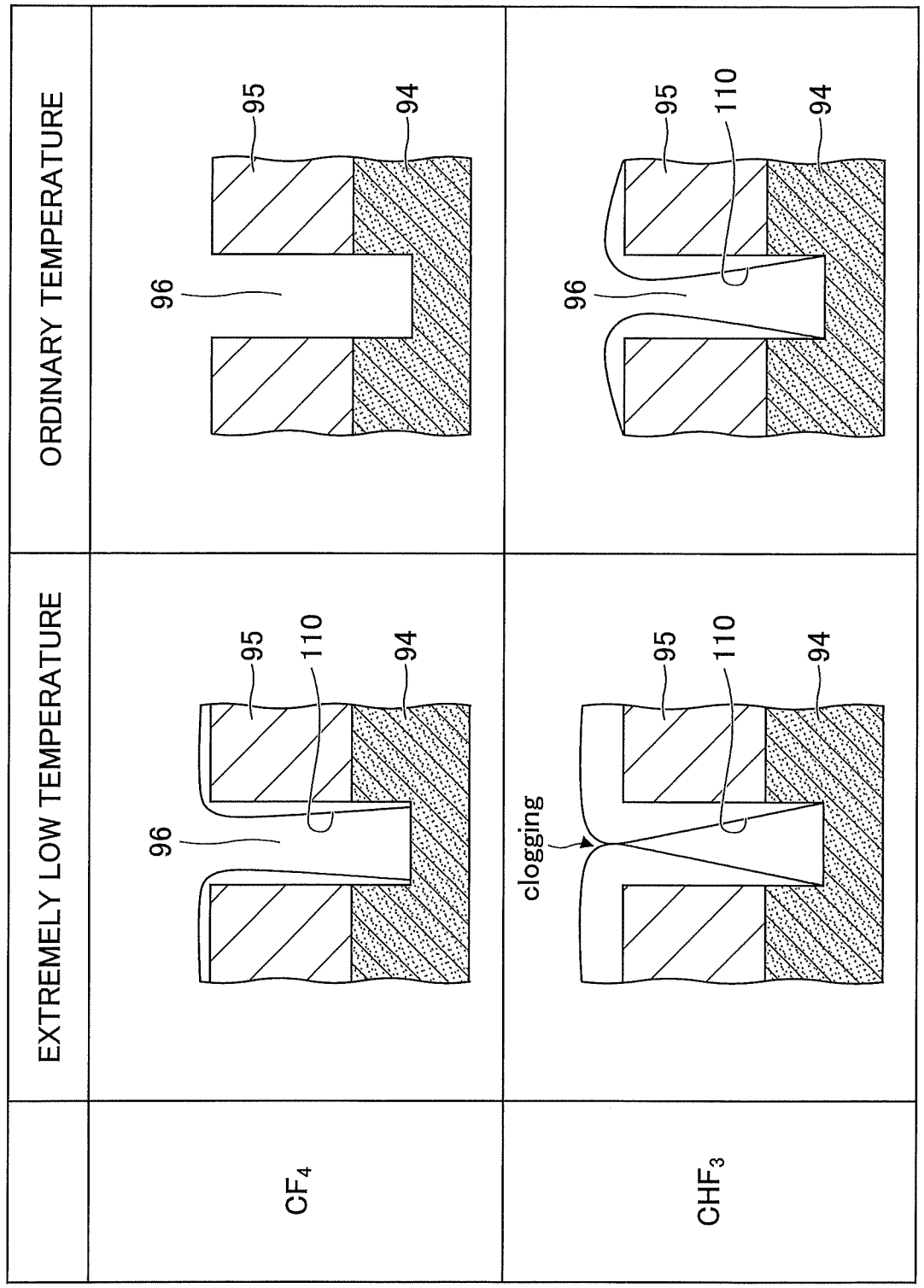
FIG. 6 is a schematic diagram illustrating a relationship between gas types used in the etching process according to the embodiment and deposition states of deposits.
Figure 7:
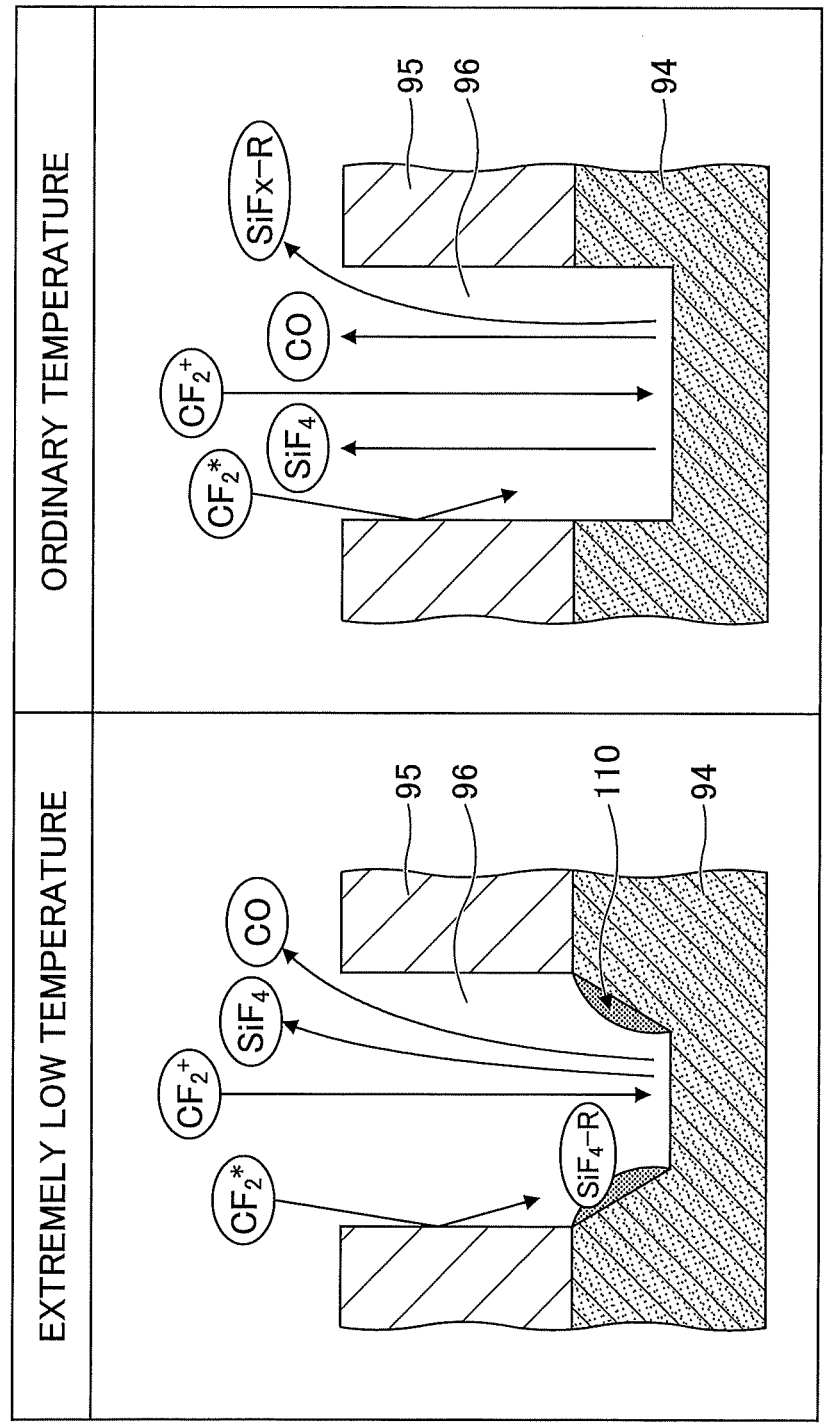
FIG. 7 is a diagram for explaining a surface reaction in the etching process according to the embodiment.

Next, the relationship between gas types used in the etching process according to the present embodiment and deposition states of deposits in the etching process will be described with reference to FIGS. 6 and 7. FIG. 6 is a schematic diagram illustrating the relationship between gas types used in the etching process according to the present embodiment and deposition states of deposits. FIG. 7 is a diagram for explaining a surface reaction in the etching process according to the present embodiment.

The deposited states of reaction products produced by etching when $CF_4$ gas was used is illustrated on an upper row of FIG. 6, and the deposited states of reaction products produced by etching when $CHF_3$ gas was used is illustrated on a lower row of FIG. 6. Both rows illustrate a case in which etching was performed at the extremely low temperature of −45° C., and a case in which etching was performed at an ordinary temperature of 0° C.

With respect to deposition property of $CH_xF_y$ gases, it is generally considered that deposition property increases in an order of $CF_4$, $CHF_3$, $CH_2F_2$, and $CH_3F$. This order is determined by a manner of dissociation of each molecule, and by sticking coefficients of radicals generated by dissociation, with respect to a deposition target film.

For example, energy required to generate $CF_x$ radicals from dissociation of $CF_4$ and $CHF_3$ gases is as follows.

Generation of CF radical, $CF_2$ radical, and $CF_3$ radical from $CF_4$ gas requires 22 eV, 19 eV, and 14.6 eV, respectively. Meanwhile, generation of CF radical, $CF_2$ radical, and $CF_3$ radical from $CHF_3$ gas requires 17 eV, 14 eV, and 13.8 eV, respectively. In other words, under conditions where the same HF power and LF power are applied, the ratio of CF radicals contained in radicals generated from $CF_4$ gas is smaller than the ratio of CF radicals contained in radicals generated from $CHF_3$ gas.

Therefore, the ratio of CF radicals generated when $CHF_3$ gas is used is higher than the ratio of CF radicals generated when $CF_4$ gas is used. Because sticking probability of CF radicals is an order of magnitude greater than that of $CF_2$ and $CF_3$ radicals, deposits 110 that adhere to an upper portion of the film are more likely to be formed in a case in which $CHF_3$ gas is used at an ordinary temperature, as illustrated in the lower row of FIG. 6. Under an extremely low temperature condition, as the amount of reaction product further increases, the risk of occurrence of blockage (clogging) increases by increasing an amount of the deposits 110 at the upper portion of the film. Conversely, in a case in which $CF_4$ gas is used, because the ratio of CF radicals is lower than that in a case in which $CHF_3$ gas is used, the deposits 110 that adhere to the upper portion of the film are less likely to be formed, and clogging is less likely to occur.

Thus, because $CF_4$ gas has a low sticking coefficient, only radicals that do not contribute to deposition are generated in the plasma when $CF_4$ gas is used at an ordinary temperature. Therefore, as illustrated in the upper row of FIG. 6, when $CF_4$ gas is used at an ordinary temperature, little or no reaction products adhere to the film. In contrast, in a case in which $CF_4$ gas is used under an extremely low temperature condition of −45° C., deposition of reaction products is started, and deposits 110 are thinly deposited on the inner wall of the second aperture 96 and on the upper portion of the film, in a conformal manner. In this case, a gas having a low sticking coefficient, such as $CF_4$ gas, is less likely to adhere to the upper portion of the film, and tends to adhere to the bottom. Thus, clogging is unlikely to occur.

As described above, because the deposition property of reaction products produced from a single gas of $CF_4$ gas is small, in the etching of the silicon-containing antireflection film 94 according to the present embodiment, it is preferable to add $H_2$ gas to $CF_4$ gas in order to improve deposition property. This allows the mixed gas of $CF_4$ gas and $H_2$ gas to have a property similar to that of $CHF_3$ gas, so that deposits 110 adhere under an ordinary temperature condition, similar to the case illustrated in the lower row of FIG. 6 in which etching is performed using $CHF_3$ gas. In addition, under an extremely low temperature condition, an amount of deposits 110 increases.

However, if an amount of $H_2$ gas to be added is too high under the extremely low temperature condition, the likelihood that clogging would occur becomes high, as the curve F illustrated in FIG. 5 indicates. As a result, the risk of occurrence of blockage of the hole is increased, as illustrated in the diagram at the lower row of the left column of FIG. 6, in which an opening of the hole is clogged with the deposits 110.

Next, the deposits 110 deposited on the sidewall of a hole formed in the silicon-containing antireflection film 94 will be described with reference to FIG. 7. A hole formed in the silicon-containing antireflection film 94 illustrated in FIG. 7 is tapering, as the deposits 110 such as reaction products produced in etching are deposited on the side surface of the hole. More specifically, the deposits 110 illustrated in FIG. 7 include reaction products generated during etching, and include radicals contained in the plasma. The deposition of the two materials promotes tapered etching that forms a cross-sectional shape of the hole in the silicon-containing antireflection film 94 into a reversed trapezoidal shape. However, tapered etching is promoted in a case in which the above-mentioned two materials (reaction products and radicals) are deposited on the silicon-containing antireflection film 94, but is not promoted in a case in which the two materials volatilize. Whether the materials are deposited on the silicon-containing antireflection film 94 or volatilize is determined by vapor pressure of each gas contributing to the etching, and the vapor pressure depends on temperature.

When a plasma is generated from the first process gas containing $CF_4$ gas, $CF_2^*$ (radical) or $CF_2^+$ (ion) in the plasma promotes etching of the silicon-containing antireflection film 94. The etching is represented by the following chemical reaction formula.

$$SiO_2 + 2CF_2 \rightarrow SiF_4 + 2CO$$

$$SiO\text{—}R + CF_2 \rightarrow SiF_x\text{—}R + CO$$

where SiO—R is an example of a silicon-containing film containing organic matter, and $SiF_x$—R is an example of a reaction product when the silicon-containing film containing organic matter is etched.

As a result of the above-described chemical reactions, the reaction product $SiF_x$—R adheres to the sidewall to form the deposits 110. According to the vapor pressure curve of $SiF_x$—R, $SiF_x$—R volatilizes at an ordinary temperature as illustrated in a right column of FIG. 7, whereas at an extremely low temperature, $SiF_x$—R deposits, as illustrated in a left column of FIG. 7. $SiF_4$ and CO volatilize at both the ordinary temperature and the extremely low temperature.

Thus, in a case in which the first process gas containing $CF_4$ gas is supplied to etch the silicon-containing antireflection film 94, an extremely low temperature of −30° C. or less is required in order to form a tapered hole in the silicon-containing antireflection film 94. By supplying the first process gas containing $CF_4$ gas under the extremely low temperature condition, the deposits 110 can be deposited on the sidewall of the hole formed in the silicon-containing antireflection film 94.

A case in which the first process gas supplied in the etching process of the silicon-containing antireflection film 94 is $CF_4$ gas or a mixture of $CF_4$ gas and $H_2$ gas is described above. However, the first process gas is not limited thereto, as long as the first process gas contains fluorocarbon gas. Further, the first process gas is preferably a mixed gas including fluorocarbon gas and hydrogen gas.

The fluorocarbon gas may be $C_xF_y$ gas that satisfies $y/x>3$. The fluorocarbon gas is dissociated to multiple types of precursors by a plasma. Preferably, the fluorocarbon gas is a gas in which an amount of $CF_2$ produced as one of the precursors is greater than amounts of the other precursors. The fluorocarbon gas may be any of $C_2F_4$, $C_3F_4$, and $C_2F_6$ gases, or may be $CF_4$ gas.

In the present embodiment, a silicon-containing antireflection film 94 is described as an example of the first film that is a silicon-containing film, but the first film is not limited thereto. The first film may further contain organic matter, or may be an organic silicon oxide film.

<Etching Process>

Figure 8:
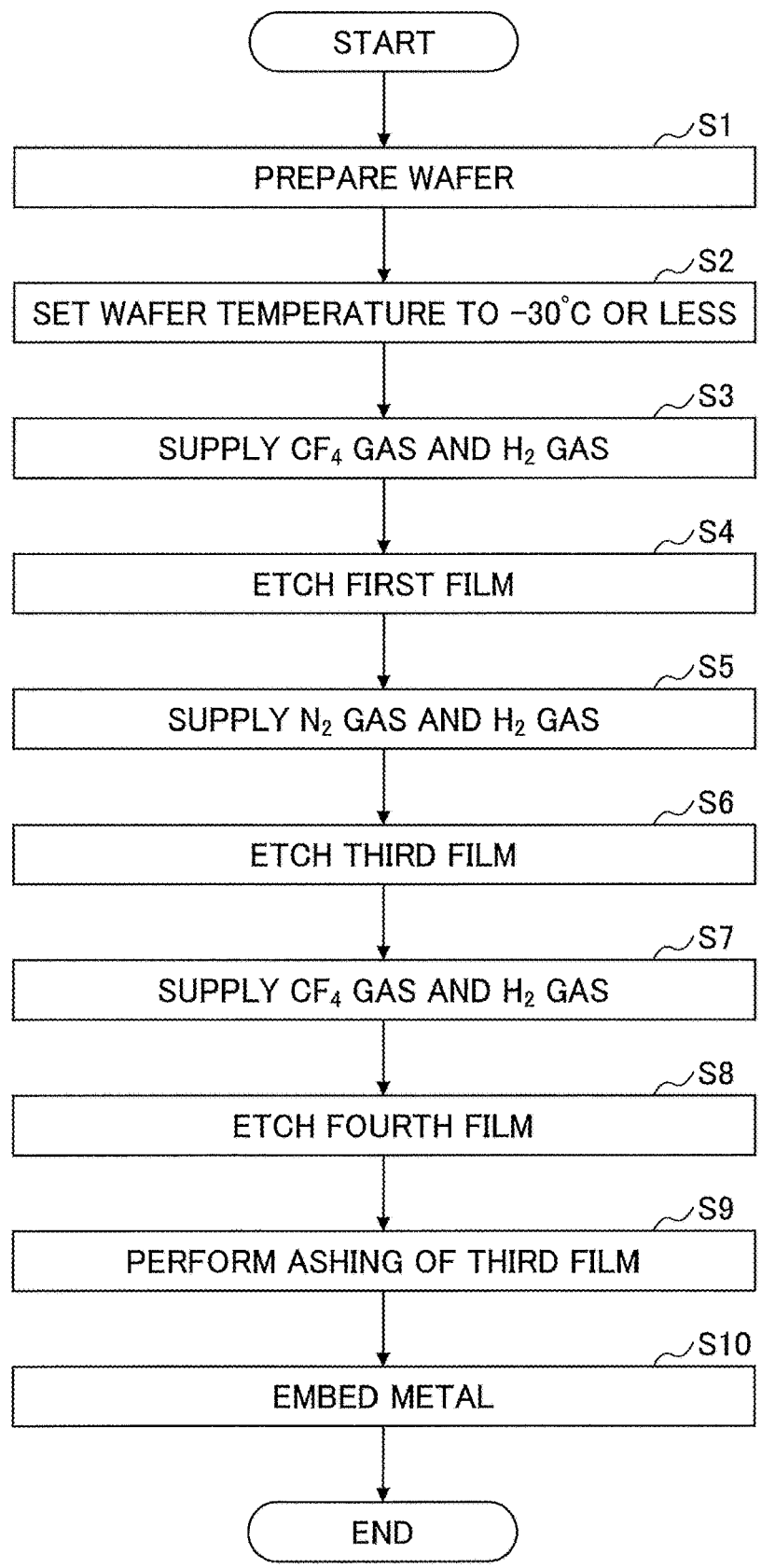
FIG. 8 is a flowchart illustrating an example of a substrate processing method according to the embodiment.

A substrate processing method including the aforementioned etching process according to the present embodiment will be described with reference to FIG. 8. FIG. 8 is a flowchart illustrating an example of the substrate processing method including the etching process according to the present embodiment. The present process is controlled by the controller 80.

First, the controller 80 prepares a wafer (substrate) W on which the silicon oxide film 92 as an example of a film to be etched (fourth film), the organic film 93 as an example of a third film, the silicon-containing antireflection film 94 as an example of a first film, and the photoresist 95 as an example of a second film are formed in sequence from the bottom. That is, the above-described wafer W is prepared by loading the wafer W into the processing vessel 10, and by holding the wafer W with the electrostatic chuck 20 (step S1). The second film (photoresist 95), the first film (silicon-containing antireflection film 94), and the third film (organic film 93) function as an etching mask.

Next, the controller 80 sets a temperature of the wafer W to −30° C. or less (step S2). The temperature of the wafer (wafer temperature) is set to a predetermined temperature of −30° C. or less by controlling a temperature of the coolant that is supplied from the chiller unit through the pipes 22a and 22b and that flows through the flow passage 18f illustrated in FIG. 1.

Next, the controller 80 supplies a mixture of $CF_4$ gas and $H_2$ gas into the processing vessel 10 (step S3). The flow rate of $H_2$ gas is determined by the above-described formula (1). Subsequently, the controller 80 applies HF power and LF power to the lower electrode 18, to etch the first film through the second aperture 96 of the second film by a plasma generated by the plasma generator (step S4). In the present embodiment, the silicon-containing antireflection film 94 is etched through the second aperture 96 of the photoresist 95 such that an etched portion is formed into a tapered shape.

Next, after the etching of the first film is completed, the controller 80 supplies a mixture of $N_2$ gas and $H_2$ gas into the processing vessel 10 (step S5).

Next, the controller 80 applies HF power and LF power to the lower electrode 18, to etch the third film through the first aperture 97 formed in the first film by a plasma generated by the plasma generator (step S6). In the present embodiment, the organic film 93 is etched through the first aperture 97 formed in the silicon-containing antireflection film 94.

Next, after the etching of the third film is completed, the controller 80 supplies a mixture of $CF_4$ gas and $H_2$ gas into the processing vessel 10 (step S7). Then, the controller 80 applies HF power and LF power to the lower electrode 18, to etch the fourth film through the aperture 98 formed in the third film by the plasma generated by the plasma generator (step S8). In the present embodiment, the silicon oxide film 92, which is an undercoat film, is etched through the aperture 98 formed in the organic film 93.

Next, the controller 80 performs aching of the third film (step S9). This removes the organic film 93 that has served as a mask in etching the silicon oxide film 92. Subsequently, a metal is embedded in a hole formed in the silicon oxide film 92 (step S10). Because the metal is embedded in the hole whose CD value is shrunk by the first aperture 97 in the silicon-containing antireflection film 94, a small contact having a CD value less than 10 nm, such as approximately 6 nm, can be formed.

<Etching of Substrate Having Second Layered Structure>

Next, an example in which a substrate processing method including the etching process according to the present embodiment is applied to a substrate W having a second layered structure will be described with reference to FIGS. 9A to 9G. FIGS. 9A to 9G are diagrams sequentially illustrating etching steps for each layer of the second layered structure according to the present embodiment.

Figure 9B:
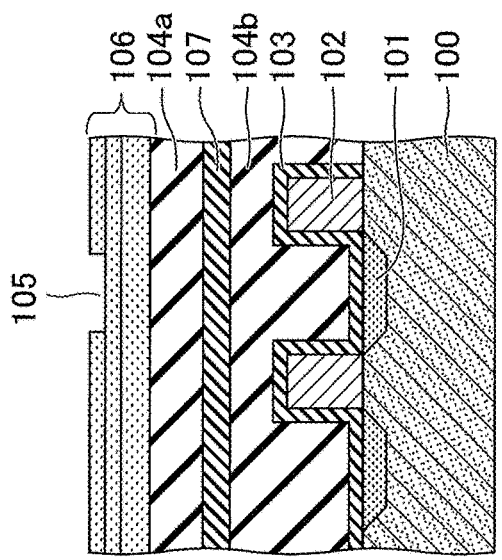
FIGS. 9A to 9G are diagrams sequentially illustrating etching steps for each layer of a second layered structure according to the embodiment.
Figure 9D:
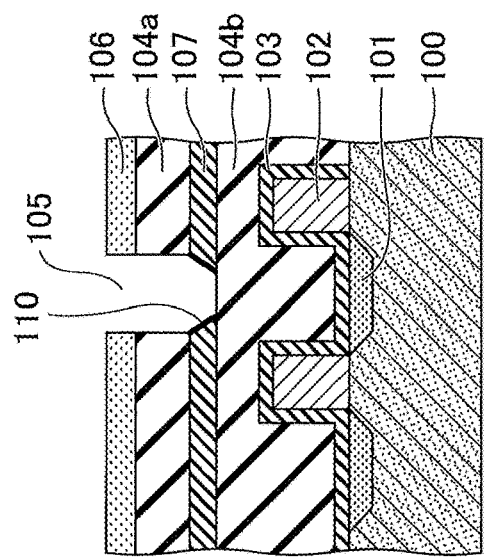
Figure 9A:
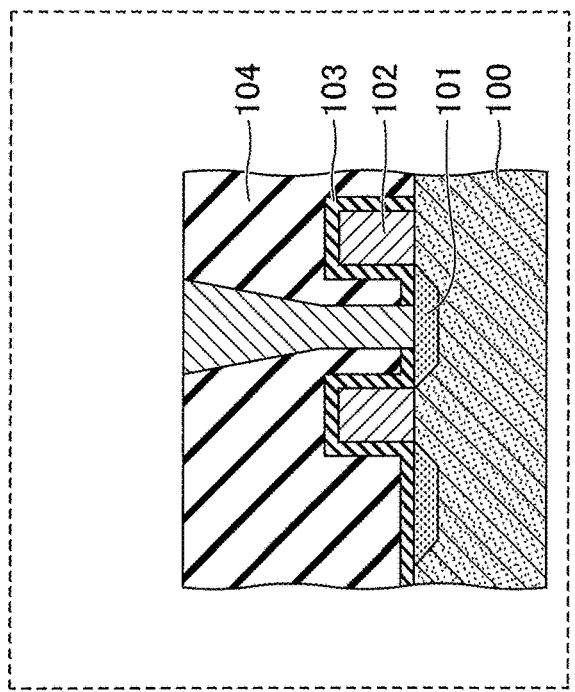
Figure 9C:
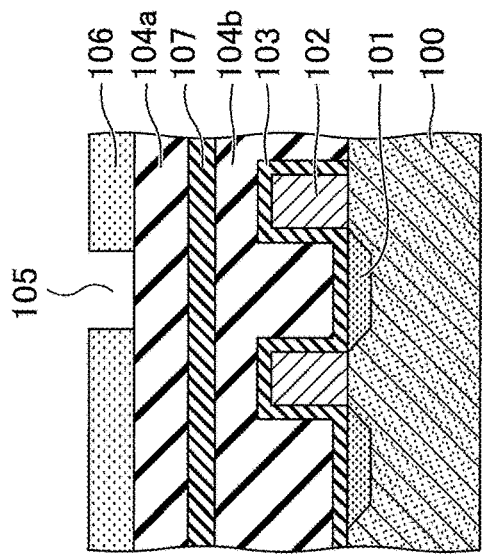
Figure 9F:
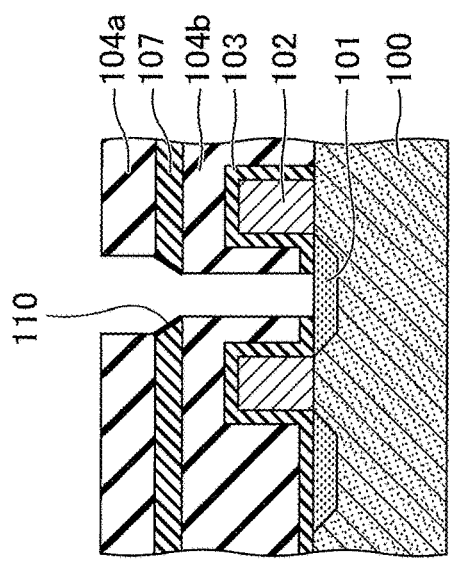

The etching process according to the present embodiment is applied to the substrate W having the second layered structure. FIGS. 9B to 9F illustrate respective steps of the etching process according to the present embodiment. After the etching process, the step of embedding a metal wire into the shrunken hole formed by the etching process is performed. FIG. 9G illustrates a state of the wafer W to which all the steps of the substrate processing method, including the etching process according to the present embodiment, are applied.

The etching process illustrated in FIGS. 9B to 9F will be described in detail. As illustrated in FIG. 9B, an impurity layer 101 is formed in a silicon substrate 100 of the second layered structure. Also, on the silicon substrate 100, a gate 102 is formed adjacent to the impurity layer 101. The impurity layer 101 and the gate 102 are coated with a silicon nitride film 103 that functions as a protective film. On the silicon nitride film 103, a silicon oxide film 104b, a silicon nitride film 107, and a silicon oxide film 104a are formed in sequence. The silicon nitride film 107 is an intermediate layer and is inserted between the silicon oxide film 104b and the silicon oxide film 104a. On the silicon oxide film 104a, a mask layer 106 is formed. A second aperture 105 is formed in the top layer in the mask layer 106.

In the initial state of the second layered structure illustrated in FIG. 9B, the silicon nitride film 107 is an example of a first film that is a silicon-containing film. A set of the silicon oxide film 104a and the mask layer 106 is an example of a second film that is formed on the first film and includes the second aperture 105. The silicon oxide film 104b under the silicon nitride film 107 is an example of a third film formed under the first film.

In the case of the second layered structure, when the substrate processing method according to the present embodiment illustrated in FIG. 8 is started, the controller 80 prepares the wafer W having the first to third films of the second layered structure. Next, as illustrated in FIGS. 9C and 9D, the controller 80 supplies a mixture of $N_2$ gas and $H_2$ gas to etch the mask layer 106 through the second aperture 105, then supplies a mixture of $CF_4$ gas and $H_2$ gas to etch the silicon oxide film 104a. Next, the silicon nitride film 107 is etched such that a cross section of a hole formed in the silicon nitride film 107 becomes a tapered shape.

In the step of tapered etching of the silicon nitride film 107, the controller 80 sets the temperature of the wafer W to −20° C. or less. Also, the controller 80 then supplies a mixture of $CF_4$ gas and $H_2$ gas into the processing vessel 10, and applies HF power and LF power to the lower electrode 18.

The controller 80 then etches the silicon nitride film 107 with a plasma generated by the plasma generator. In the etching step, the chemical reaction of SiN (silicon nitride film 107) with the supplied mixed gas of $CF_4$ and $H_2$ results in a reaction product of ammonium fluorosilicate (($NH_4)_2$ $SiF_6$) forming the deposits 110 to promote tapered etching. In this manner, a silicon nitride film 107 may be formed at a location where tapered etching should be promoted to shrink the CD value.

Figure 9E:
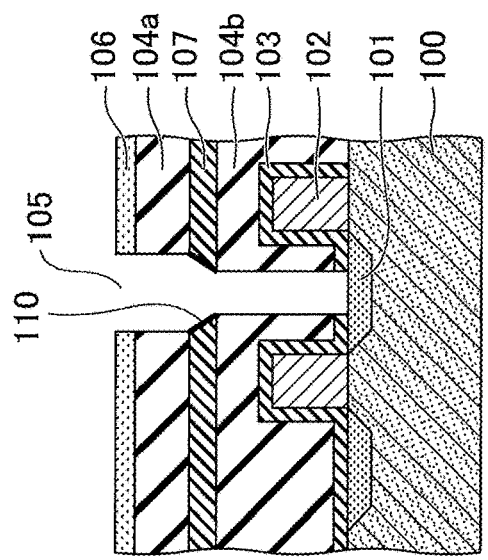
Figure 9G:
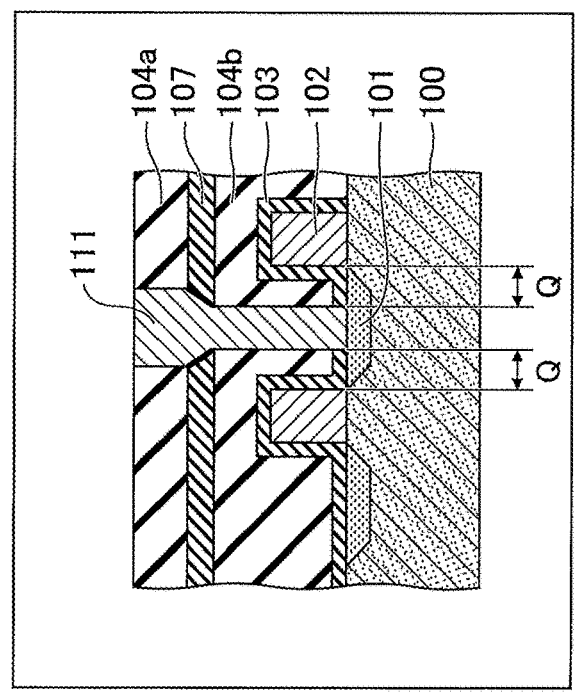

Next, as illustrated in FIG. 9E, the controller 80 supplies a mixture of $CF_4$ gas and $H_2$ gas, to etch the silicon oxide film 104b through a first aperture formed in the silicon nitride film 107 having a tapered shape, until the silicon nitride film 103 is exposed. At this time, it is preferable to control the wafer temperature to −30° C. or less. By etching the silicon oxide film 104b with a plasma formed from the mixed gas of $CF_4$ and $H_2$ while the wafer W is cooled to −30° C. or less, a hole of vertical shape can be formed in the silicon oxide film 104b. This allows a predetermined distance to be maintained between the gate 102 and the hole. The mixed gas of $CF_4$ gas and $H_2$ gas supplied in the step of etching the silicon oxide film 104b is an example of a second process gas. Other examples of the second process gas include a mixture of $C_4F_8$ gas, $O_2$ gas, and Ar gas, and a mixture of $C_4F_6$ gas, $O_2$ gas, and Ar gas. Subsequently, the controller 80 supplies a mixture of $CH_2F_2$ gas, $O_2$ gas, and Ar gas, to etch the silicon nitride film 103 until the impurity layer 101 is exposed.

Next, as illustrated in FIG. 9F, the controller 80 supplies $O_2$ gas or a mixture of $N_2$ gas and $H_2$ gas, to remove the mask layer 106 by ashing. Next, as illustrated in FIG. 9G, the controller 80 embeds metal in the etched hole to form a wiring layer 111. The step of removing the mask layer 106 may be performed by a device different from an apparatus (substrate processing apparatus 1) that performs etching. For example, the step of removing the mask layer 106 may be performed by a high-temperature plasma ashing device. Alternatively, the mask layer 106 may be removed by wet cleaning.

As illustrated in FIG. 9G, with respect to the hole formed by performing the etching process according to the present embodiment, CD of the lower portion of the hole is smaller than CD of the upper portion of the hole. That is, the lower portion of the hole is shrunk in the etching process. This ensures a distance Q between the gate 102 and the hole.

According to the substrate processing method including the above-described etching process, CD of the upper end of the etched hole is greater than CD of the hole near the gate 102. The CD at the upper end of the hole is limited by adjacent wiring.

For example, suppose a case of etching the silicon oxide films 104a and 104b under the same process condition as that in the etching of the silicon nitride film 107, to perform tapered etching of the silicon oxide films 104a and 104b. As this increases a tapered portion of the hole as illustrated in FIG. 9A, a distance between the gate 102 and the hole may not be able to be secured.

Thus, in the etching process according to the present embodiment, tapered etching is applied to only the silicon nitride film 107, which is an intermediate layer, using a plasma in which hydrogen and fluorine are present, under an extremely low temperature condition of −20° C. or less. This creates ammonium fluorosilicate during the etching of the silicon nitride film 107, and ammonium fluorosilicate adheres to the surface of the silicon nitride film 107 to form the deposits 110. As a result, a hole formed in the silicon nitride film 107 can be etched into a tapered shape. In the subsequent etching steps, process conditions are changed so that an etching profile of a hole formed by the subsequent etching steps becomes a vertical shape.

As described above, if the silicon nitride film 107 as the intermediate layer is etched while causing ammonium fluorosilicate to be deposited on an etched surface of the silicon nitride film 107, in order to form an etching profile into a tapered shape, the distance Q between the gate 102 and the hole can be controlled to be a predetermined distance or more, as illustrated in FIG. 9G.

In the above description, although a silicon nitride film is used as the intermediate layer of the second layered structure, the intermediate layer is not limited thereto if ammonium fluorosilicate is generated during etching of the intermediate layer. For example, a silicon film containing nitrogen, such as a silicon oxide film with SiON, can be expected to induce the same effect.

<Etching of Substrate Having Third Layered Structure>

Figure 10A:
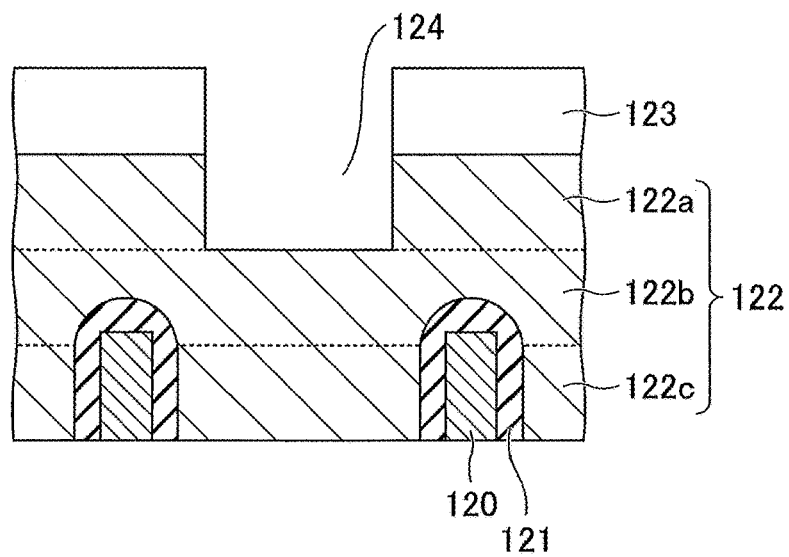
FIGS. 10A to 10C are diagrams illustrating etching steps applied to respective layers of a third layered structure according to the embodiment.
Figure 10B:
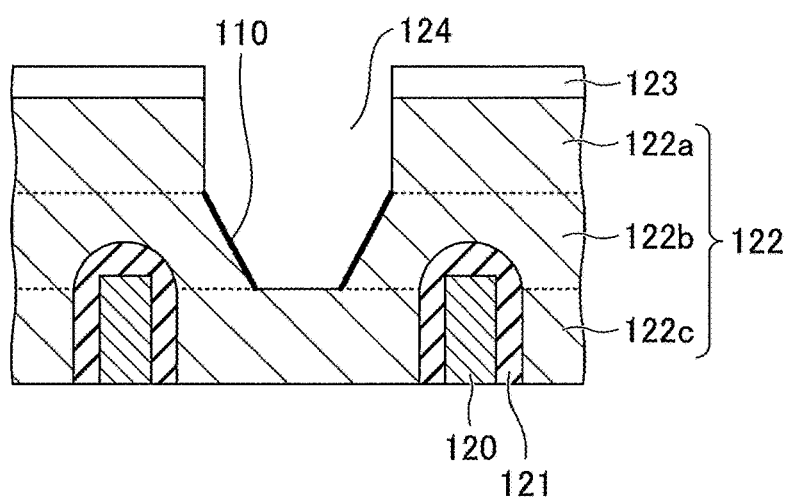
Figure 10C:
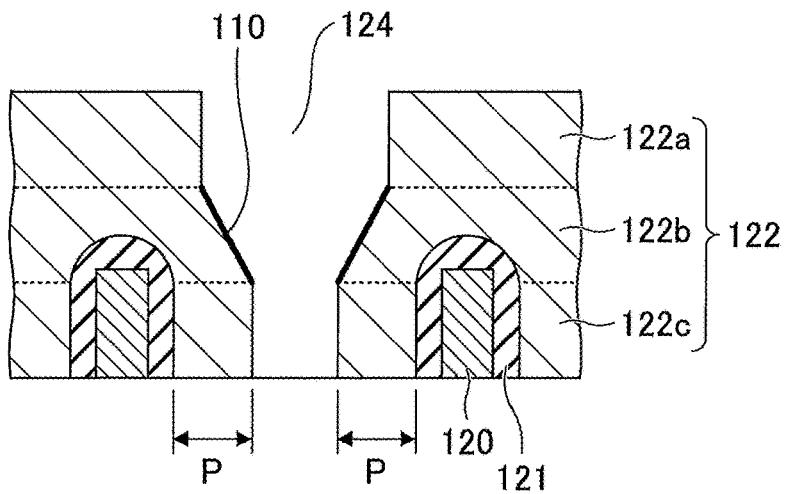

Next, an example in which the substrate processing method including the etching process according to the present embodiment is applied to a wafer W having a third layered structure will be described with reference to FIGS. 10A to 10C. FIGS. 10A to 10C are diagrams illustrating etching steps applied to respective layers of the third layered structure according to the present embodiment.

As illustrated in FIG. 10A, in the third layered structure, a gate 120 and a silicon nitride film 121 as a protective film covering the gate 120 are formed at the bottom of a low-k (low-permittivity) film 122. In FIGS. 10A to 10C, although the low-k film 122 includes three low-k films 122a, 122b, and 122c, the low-k films 122a, 122b, and 122c are made of identical material and the low-k film 122 is substantially a single film. However, for convenience of description, the low-k film 122 will be described as a set of three films (low-k films 122a, 122b, and 122c). The low-k film 122b is an example of a first film that is etched into a tapered shape. The low-k film 122a is an example of a second film having a second aperture 124. The low-k film 122c is an example of a third film that becomes an undercoat film of the first film. A mask 123 is formed on the upper surface of the low-k film 122a.

Also, when etching the third layered structure, the controller 80 supplies a mixture of $C_4F_8$ gas, Ar gas, and $N_2$ gas to etch the low-k film 122a. Next, the controller 80 supplies a mixture of $CF_4$ gas and $H_2$ gas only during an etching step of the low-k film 122b, and the low-k film 122b is etched by setting a wafer temperature to an extremely low temperature of −30° C. or less, and by applying HF power and LF power. This allows the low-k film 122b to be etched in a tapered shape, and deposits 110 can be deposited during etching, as illustrated in FIG. 10B. Thus, CD of the lower end (bottom) of a hole formed in the low-k film 122b can be made to be less than that of the upper end of the hole. Next, the controller 80 supplies a mixture of $C_4F_8$ gas, Ar gas, and $N_2$ gas again to etch the low-k film 122c. This causes the low-k film 122c to be etched vertically, allowing the distance P between the gate 120 and the hole to be equal to or greater than a predetermined value, as illustrated in FIG. 10C. The mixture of $C_4F_8$ gas, Ar gas, and $N_2$ gas supplied when the low-k film 122c is etched is an example of a second process gas.

As described above, according to the etching method of the present embodiment, with respect to the first to third layered structures, CD of the aperture formed in the film by etching can be reduced without clogging the aperture.

The first film to which the tapered etching is applied may be a low dielectric constant film such as the low-k film 122 of FIGS. 10A to 10C, or an antireflection film such as the silicon-containing antireflection film 94 of FIGS. 2 and 3. The first film may also contain nitrogen, like the silicon nitride film 107 of FIG. 9B. The first film may be a silicon nitride film or a silicon oxynitride film.

When etching the first film, a temperature of the substrate (wafer), which is set to an extremely low temperature, may be −30° C. or less. The lower limit of the temperature is not particularly limited, but may be, for example, equal to or greater than −60° C. due to limitations of a configuration of the substrate processing apparatus.

During the step of etching the third film formed under the first film through the first aperture formed in the first film after the step of etching the first film, it is preferable to control the wafer temperature to −30° C. or less. However, the temperature is not limited thereto.

In the step of etching the third film, the third film may be etched using a plasma formed from the second process gas, through the first aperture.

The temperature of the wafer (substrate) during the step of etching the third film may be equal to the temperature of the wafer during the step of etching the first film (first temperature), or may be different.

When the first film is etched into the tapered shape, $V_{DC}$ (self-bias) may be 2000 V for example, from the perspective of control.

The substrate processing method and the substrate processing apparatus according to the embodiment disclosed herein are to be considered exemplary in all respects and not limiting. The above embodiments may be modified and enhanced in various forms without departing from the appended claims and spirit thereof. Matters described in the above embodiments may take other configurations to an extent not inconsistent, and may be combined to an extent not inconsistent.

The substrate processing apparatus according to the present disclosure is applicable to any type of substrate processing apparatus, including an atomic layer deposition (ALD) apparatus, a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

What is claimed is:
1. A method of processing a substrate comprising:
preparing the substrate including a first film of a silicon-containing film and a second film in which a second aperture is formed, the second film being formed on the first film;
maintaining a temperature of the substrate to −30° C. or less; and
etching the first film through the second aperture using a plasma formed from a first process gas containing a fluorocarbon gas, to form a first aperture of a tapered shape in the first film such that a width of the first aperture gradually decreases toward a bottom of the first aperture,
wherein the substrate further includes a third film formed under the first film; and
the method further comprises etching the third film through the first aperture, after the etching of the first film, said third film being spin-on carbon film or amorphous carbon.
2. The method according to claim 1, wherein the first film is an antireflection film or a low dielectric constant film.
3. The method according to claim 1, wherein the first film contains nitrogen.
4. The method according to claim 1, wherein the first film is a silicon nitride film or a silicon oxynitride film.
5. The method according to claim 1, wherein the etching of the third film includes controlling the temperature of the substrate to −30° C. or less.
6. The method according to claim 1, wherein the first process gas contains $H_2$ gas.
7. The method according to claim 6, wherein an amount of the $H_2$ gas contained in the first process gas satisfies a condition of

$$0 \leq y \leq 0.0078x^2 - 0.3938x + 11.877,$$

wherein y is a partial pressure percentage (%) of the $H_2$ gas contained in the first process gas, and x is a temperature (° C.) of the substrate between −70° C. and −30° C.
8. The method according to claim 1, wherein the fluorocarbon gas is $C_xF_y$ gas, where relationship between x and y satisfies y/x >3.
9. The method according to claim 8, wherein the fluorocarbon gas is $CF_4$ gas.
10. The method according to claim 1, wherein the fluorocarbon gas is dissociated to multiple types of precursors by a plasma, and an amount of $CF_2$ of the precursors is greater than amounts of other precursors.
11. The method according to claim 10, wherein the fluorocarbon gas is any one of $C_2F_4$ gas, $C_3F_4$ gas, and $C_2F_6$ gas.
12. The method according to claim 1, wherein the first film contains organic matter.
13. The method according to claim 12, wherein the first film is an organic silicon oxide film.
14. The method according to claim 1, wherein the third film is etched using a plasma formed from a second process gas.
15. The method according to claim 14, wherein the second process gas is selected from the group consisting of $N_2$ gas, $H_2$ gas, $O_2$ gas, $CO_2$ gas, $SO_2$ gas and COS gas, or the second process gas is a mixed gas of $N_2$ gas and $H_2$ gas, a mixed gas of $O_2$ gas and $CO_2$ gas, a mixed gas of $O_2$ gas and $SO_2$ gas, or a mixed gas of $O_2$ gas and COS gas.
16. The method according to claim 1, wherein
the substrate further includes a fourth film formed under the third film; and the method further comprises etching the fourth film through the first aperture, after the etching of the third film.

17. The method according to claim 16, wherein the fourth film is etched through the first aperture using a plasma formed from a third process gas.

18. The method according to claim 17, wherein the third process gas is selected from the group consisting of $CF_4$ gas, $H_2$ gas, $C_4F_6$ gas, $O_2$ gas, Ar gas and $C_4F_8$ gas, or the third process gas is a mixed gas of $CF_4$ gas and $H_2$ gas, a mixed gas of $C_4F_6$ gas, $O_2$ gas, and Ar gas, and a mixed gas of $C_4F_8$ gas, $O_2$ gas, and Ar gas.

* * * * *